US010124405B2

(12) United States Patent
Wang et al.

(10) Patent No.: US 10,124,405 B2
(45) Date of Patent: Nov. 13, 2018

(54) MANUFACTURING METHOD FOR METALLIC HOUSING OF ELECTRONIC DEVICE

(71) Applicants: Fu Zhun Precision Industry (Shen Zhen) Co., Ltd., Shenzhen (CN); Foxconn Technology Co., Ltd., New Taipei (TW)

(72) Inventors: Cai-Hua Wang, Shenzhen (CN); Yue-Jian Li, Shenzhen (CN); Chen-Shen Lin, New Taipei (TW); Wen-Hsiung Chang, New Taipei (TW); Chun-Jung Chang, New Taipei (TW)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 372 days.

(21) Appl. No.: 15/161,305

(22) Filed: May 23, 2016

(65) Prior Publication Data
US 2016/0263650 A1 Sep. 15, 2016

Related U.S. Application Data

(62) Division of application No. 13/951,667, filed on Jul. 26, 2013, now Pat. No. 9,370,823.

(30) Foreign Application Priority Data

Jul. 19, 2013 (CN) .......................... 2013 1 0304790

(51) Int. Cl.
*B22D 19/16* (2006.01)
*B22D 19/04* (2006.01)
(Continued)

(52) U.S. Cl.
CPC .............. *B22D 19/16* (2013.01); *B22C 9/108* (2013.01); *B22C 9/22* (2013.01); *B22D 17/00* (2013.01);
(Continued)

(58) Field of Classification Search
CPC ......... B22D 17/24; B22D 19/00; B22D 25/02
See application file for complete search history.

(56) References Cited

U.S. PATENT DOCUMENTS 7,654,305 B2 * 2/2010 Hirao .................... B22D 17/22
164/113
2003/0019604 A1 * 1/2003 Ishiduka ................ B22D 17/00
164/98

(Continued)

FOREIGN PATENT DOCUMENTS

CN 202617527 U 12/2012
CN 102932503 A 2/2013
JP 2010124072 A 6/2010

*Primary Examiner* — Kevin E Yoon
(74) *Attorney, Agent, or Firm* — ScienBiziP, P.C.

(57) ABSTRACT

A manufacturing method for a metallic housing of an electronic device is provided. The method includes providing a die-casting mold including a male die and a female die; positioning an outer frame in a cavity of the female die, the outer frame including a plurality of latching portions protruding from an inner surface inwardly and a plurality of latching grooves, each latching portion including at least one receiving groove; assembling the male die to the female die; casting pressured molten metal-alloy into the cavity to form an inner structural member embedded in the outer frame, the inner structural member including a plurality of engaging portions respectively embedded in the plurality of receiving grooves, and a plurality of matching portions respectively embedded in the plurality of latching grooves; dissembling the male die from the female die; and removing the outer frame and the inner structural member from the female die.

8 Claims, 6 Drawing Sheets

(51) Int. Cl.
*B22D 25/02* (2006.01)
*B22D 19/00* (2006.01)
*B22D 17/22* (2006.01)
*H05K 5/02* (2006.01)
*B22D 17/00* (2006.01)
*B22C 9/10* (2006.01)
*B22C 9/22* (2006.01)
*B22D 17/02* (2006.01)
*B22D 21/00* (2006.01)
*B22D 29/00* (2006.01)
*H05K 5/04* (2006.01)

(52) U.S. Cl.
CPC ............ *B22D 17/005* (2013.01); *B22D 17/02* (2013.01); *B22D 17/2218* (2013.01); *B22D 19/00* (2013.01); *B22D 19/04* (2013.01); *B22D 21/007* (2013.01); *B22D 25/02* (2013.01); *B22D 29/00* (2013.01); *H05K 5/0217* (2013.01); *H05K 5/0243* (2013.01); *H05K 5/04* (2013.01)

(56) References Cited

U.S. PATENT DOCUMENTS

| 2011/0195271 A1* | 8/2011 | Zadesky | B23K 20/021 |
| | | | 428/615 |
| 2013/0136946 A1* | 5/2013 | Liu | B22D 19/0081 |
| | | | 428/615 |
| 2014/0072761 A1* | 3/2014 | Kawada | B29C 45/14311 |
| | | | 428/138 |

* cited by examiner

MANUFACTURING METHOD FOR METALLIC HOUSING OF ELECTRONIC DEVICE

CROSS-REFERENCE TO RELATED APPLICATION

The present application is a divisional application of U.S. patent application Ser. No. 13/951,667, filed on Jul. 26, 2013, which claims priority to Chinese Application No. 201310304790.8 filed on Jul. 19, 2013, the contents of which are entirely incorporated by reference herein.

FIELD

The present disclosure relates to a housing of an electronic device and a manufacturing method thereof, and more particularly to a metallic housing of an electronic device and a manufacturing method thereof.

BACKGROUND

Magnesium alloy, aluminum alloy, and zinc alloy are often used to make housings of electronic devices, due to their light weight, high scalability, easy molding, and high structural strength. Because metal-alloys do not possess the attractive metallic appearance of pure metals, a metallic layer is coated onto an outer surface of the housing to enhance the metallic appearance. However, the manufacturing procedure is complex and expensive.

BRIEF DESCRIPTION OF THE DRAWINGS

Implementations of the present technology will now be described, by way of example only, with reference to the attached figures.

DETAILED DESCRIPTION

Figure 1:
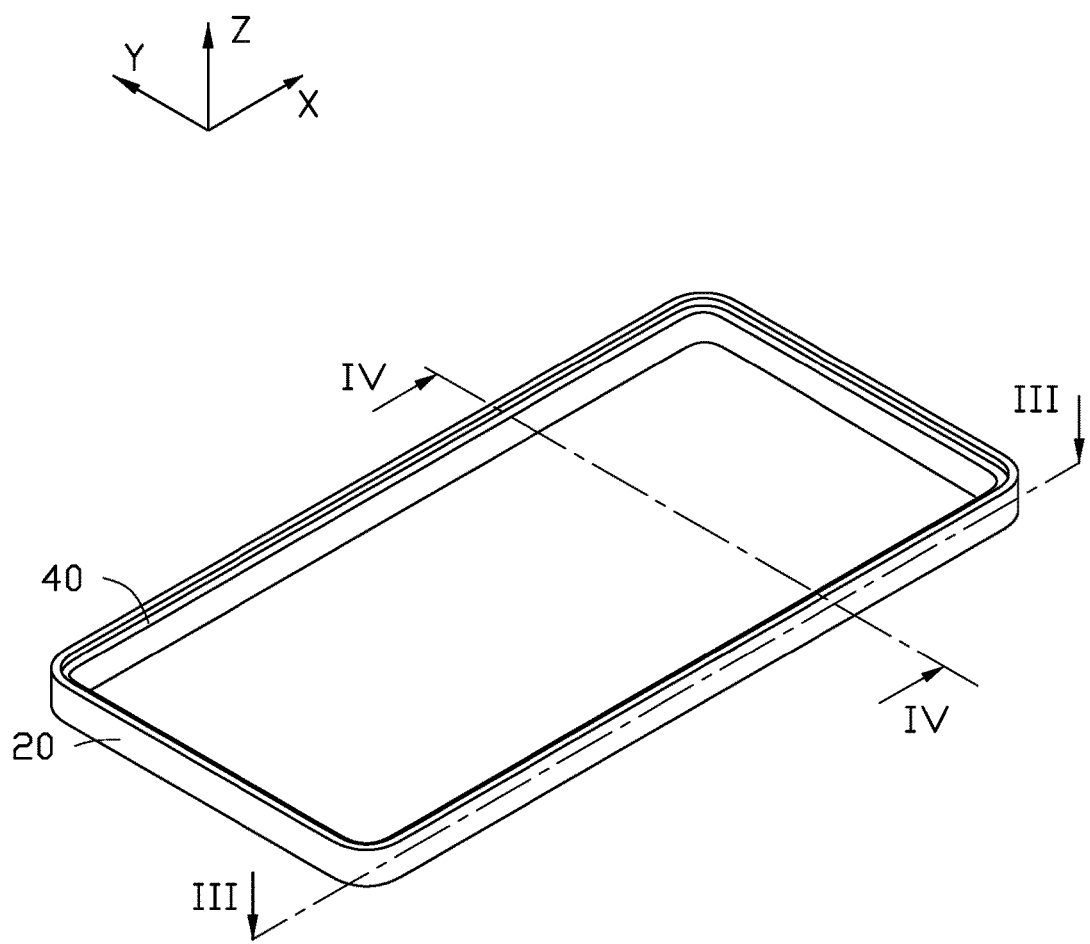
FIG. 1 is an isometric view of an embodiment of a metallic housing of an electronic device. The metallic housing includes an outer frame.
Figure 2:
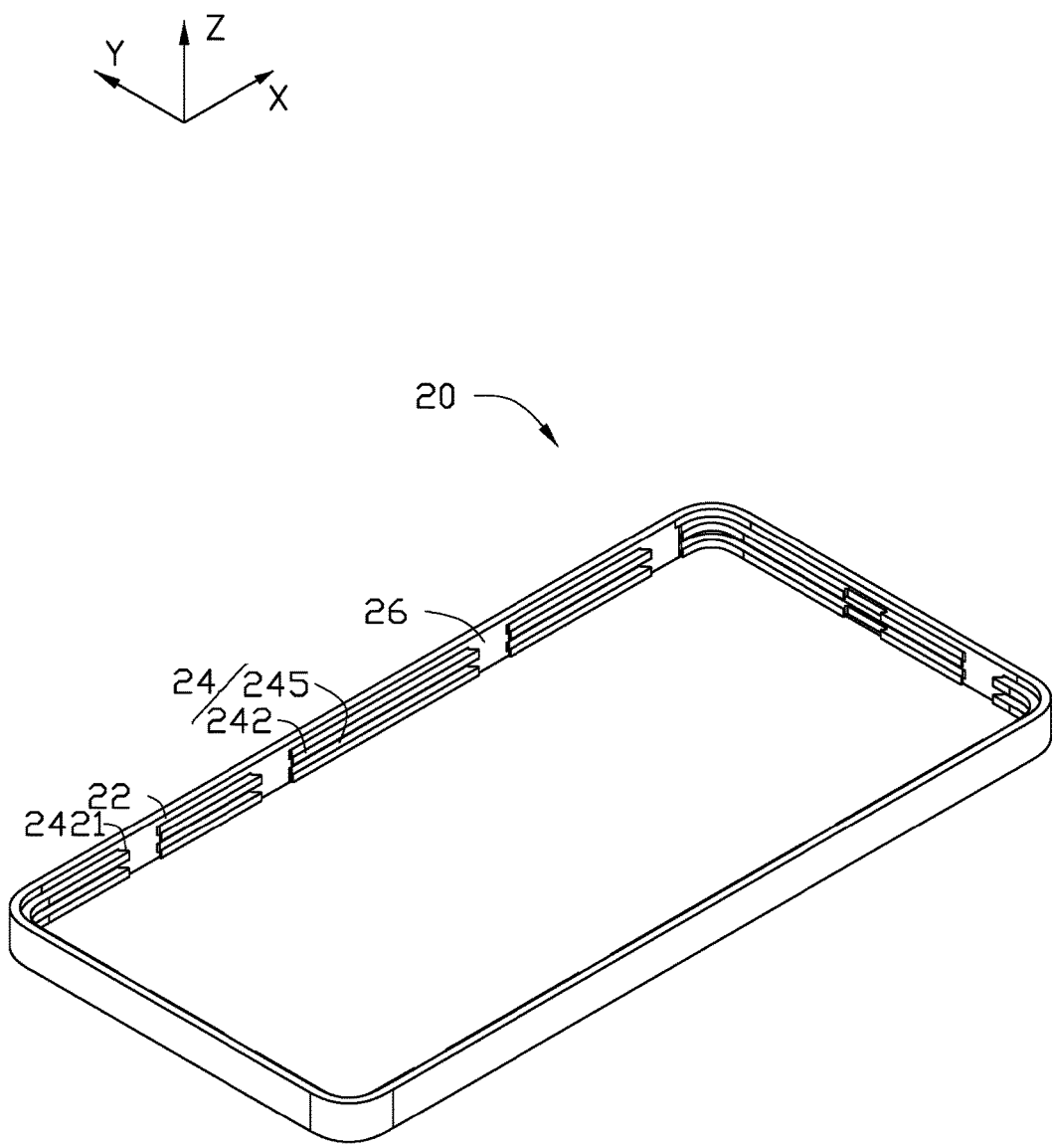
FIG. 2 is an isometric view of the outer frame of FIG. 1.
Figure 3:
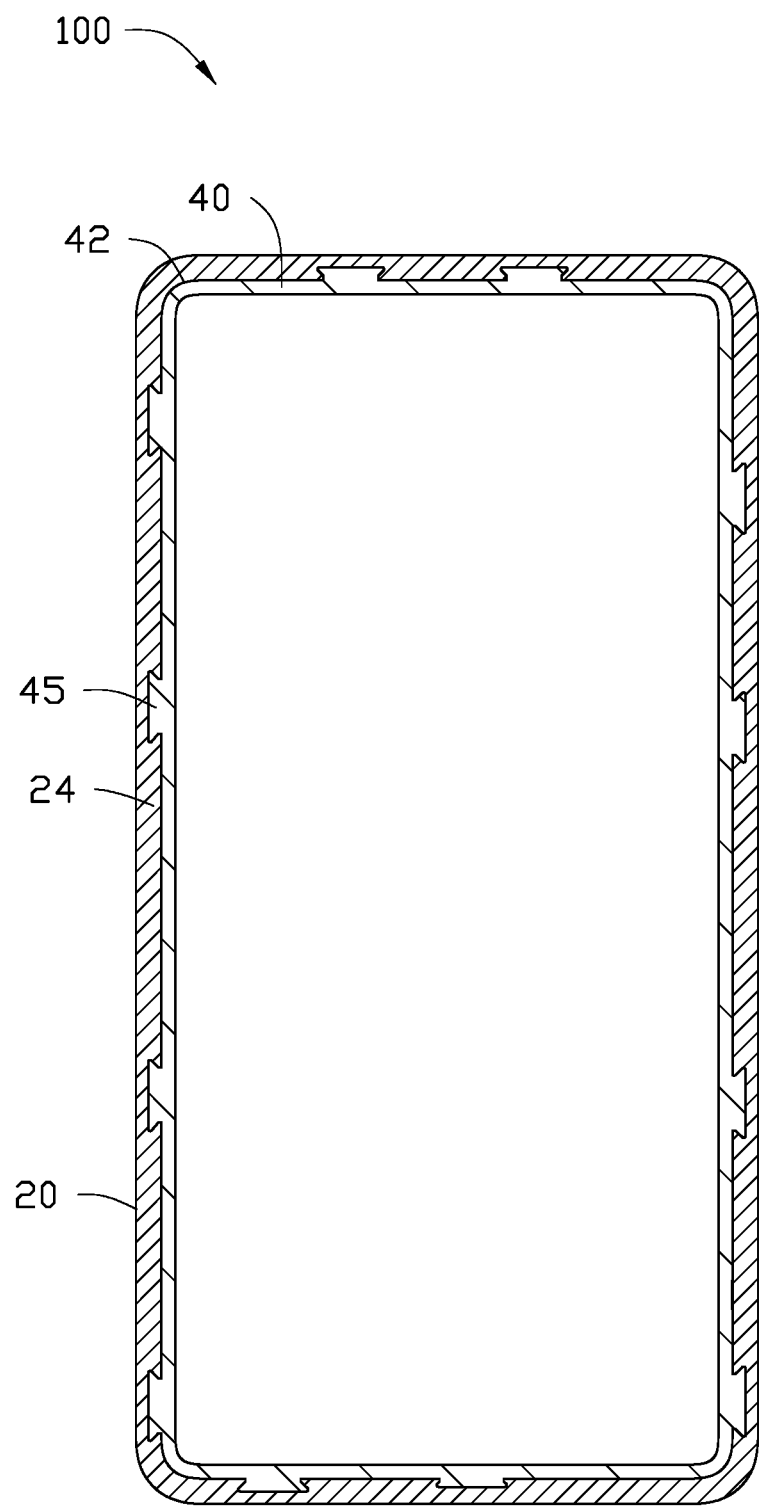
FIG. 3 is a cross-sectional view of the metallic housing of FIG. 1, taken along line III-III.

Referring to FIGS. 1 through 3, an embodiment of a metallic housing 100 in an electronic device (not shown) includes an outer frame 20 and an inner structural member 40. The inner structural member 40 is received within the outer frame 20 and is inset on an inner surface 22 of the outer frame 20.

Figure 4:
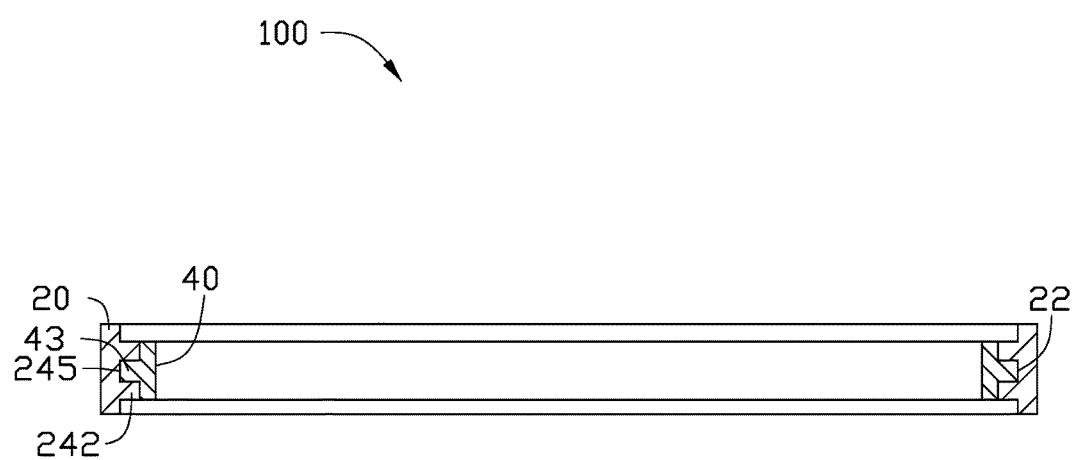
FIG. 4 is a cross-sectional view of the metallic housing of FIG. 1, taken along line IV-IV.

Also referring to FIG. 4, the outer frame 20 is substantially rectangular. The outer frame 20 includes a plurality of latching portions 24 and defines a plurality of latching grooves 26. The plurality of latching portions 24 are arranged on the inner surface 22 along an extending direction of the outer frame 20. The latching portions 24 are spaced from each other, thereby forming the plurality of latching grooves 26 in between. Each latching portion 24 includes a pair of protruding latching ribs 242 and a receiving groove 245 defined between the pair of latching ribs 242. The pair of latching ribs 242 are substantially parallel to each other. The pair of latching ribs 242 extend along an extending direction of the outer frame 20 and transverse a corner of the outer frame 20. Each latching rib 242 defines an inclining surface 2421 on opposite ends. The inclining surface 2421 and the inner surface 22 of the outer frame 20 cooperatively form an angle. A cross-sectional view of the receiving groove 245 is substantially rectangular. Each latching groove 26 is located between two adjacent latching portions 24, and is bounded by two inclining surfaces 2421 of the two adjacent latching portions 24. In the embodiment, the latching groove 26 is a dovetail groove.

The outer frame 20 is made of stainless steel, aluminum, titanium, or the like. In the illustrated embodiment, the outer frame 20 is made of stainless steel by die-casting. A number of latching ribs 242 and a number of receiving grooves 245 may be changed according to requirements.

In the illustrated embodiment, the inner structural member 40 is an internal frame similar to the outer frame 20. The inner structural member 40 includes a peripheral sidewall 42, a plurality of engaging portions 43 protruding from the peripheral sidewall 42, and a plurality of matching portions 45. The plurality of engaging portions 43 protrude from an outer surface of the peripheral sidewall 42 and are spaced from each other. The engaging portion 43 is a rib extending along an extending direction of the peripheral sidewall 42 and is received by a corresponding receiving groove 245 of the outer frame 20. Each engaging portion 43 resists two latching ribs 242 at opposite sides to hold the inner structural member 40. Each of the engaging portions 43 further resists the inner surface 22 on a bottom of the corresponding receiving groove 245 to hold the inner structural member 40. The plurality of matching portions 45 protrude from an outer surface of the peripheral sidewall 42 and are spaced from each other. The plurality of matching portions 45 are respectively received in the plurality of latching grooves 26 of the outer frame 20. The plurality of matching portions 45 extend along a direction perpendicular to the extending direction of the metallic outer frame 20, and are respectively embedded in the plurality of latching grooves 26 on two opposite sides of the receiving groove 245. Each matching portion 45 is a dovetail block and resists two latching portions 24 at opposite sides, thereby holding the inner structural member 40. The inner structural member 40 may be made of magnesium alloy, aluminum alloy, zinc alloy, or other metal-alloy. The inner structural member 40 may be made by die-casting or forging. In the embodiment, the inner structural member 40 is made from aluminum alloy by die-casting. In other embodiments, the inner structural member 40 may be a metallic board.

A shape of the latching portions 24 is not limited, and the inner structural member 40 may be equipped with a plurality of engaging structures to engage with the plurality of latching portions 24. If the plurality of latching portions 24 and the plurality of engaging portions 43 can hold the inner structural member 40 in the outer frame 20 steadily, the plurality of latching grooves 26 and the plurality of matching portions 45 may be omitted.

Figure 5:
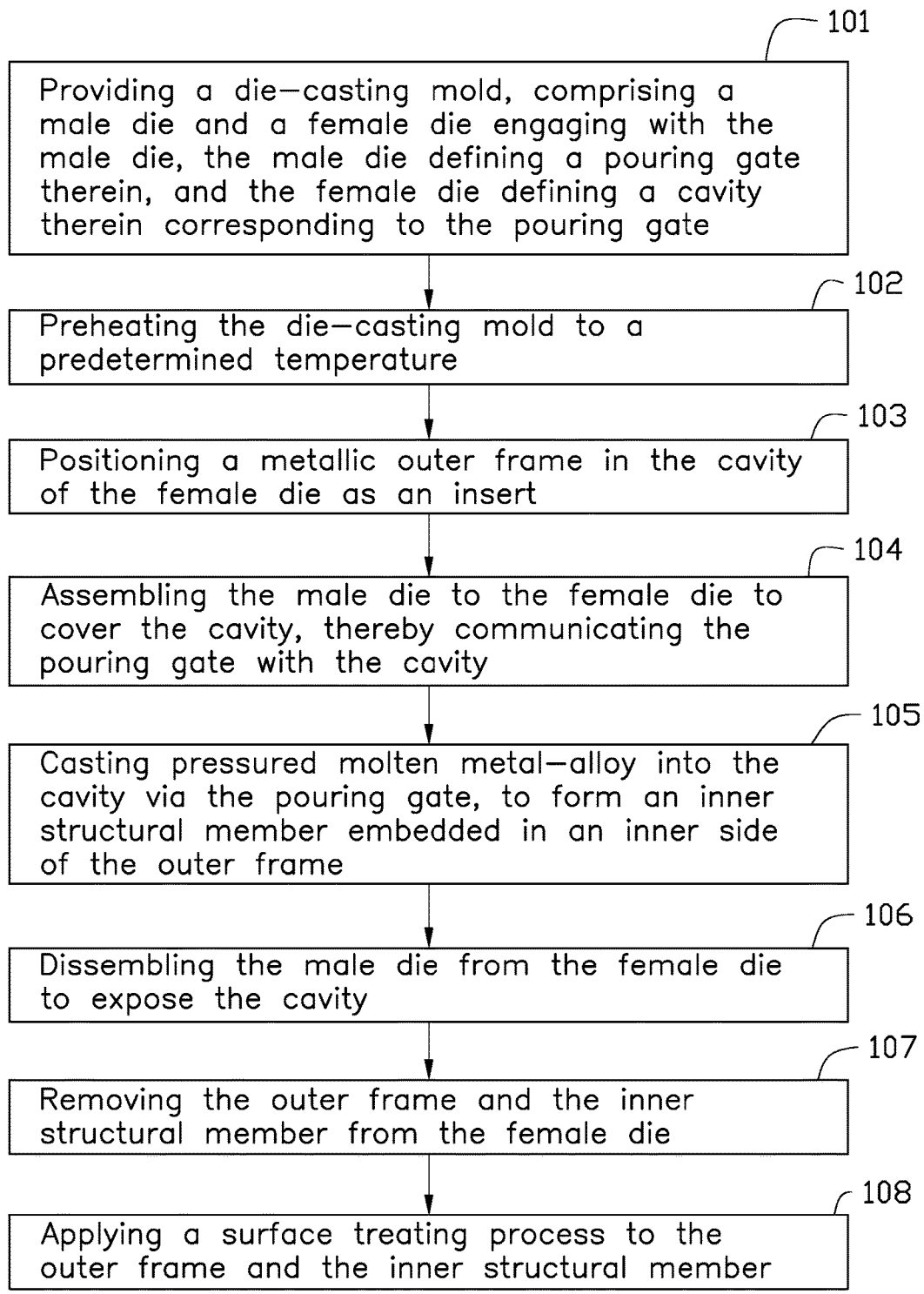
FIG. 5 is a flow chart of an embodiment of a manufacturing method for the metallic housing of FIG. 1.
Figure 6:
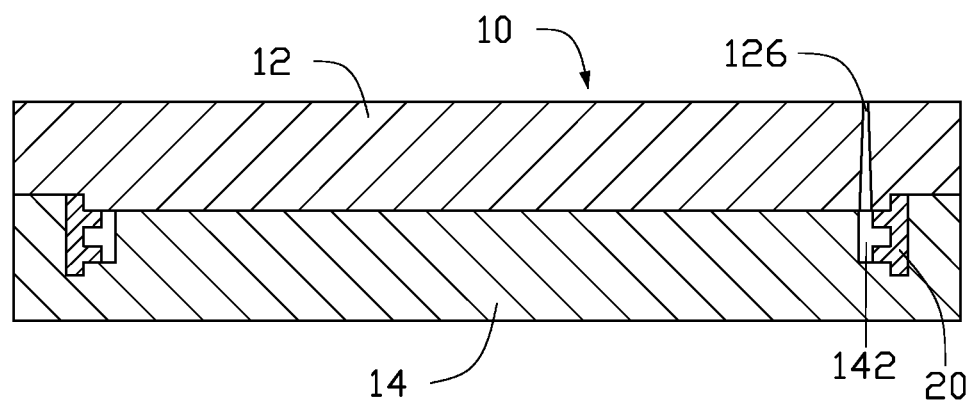
FIG. 6 is a cross-sectional view of a die-casting mold employed in the manufacturing method for the metallic housing of FIG. 1.

Referring to FIGS. 5 and 6, an embodiment of a manufacturing method of the metallic housing 100 is illustrated.

In step 101, a die-casting mold 10 is provided. The die-casting mold 10 includes a male die 12 and a female die 14 engaging with the male die 12. The male die 12 defines a pouring gate 126 therein, and the female die 14 defines a cavity 142 therein corresponding to the pouring gate 126.

In step 102, the die-casting mold 10 is preheated to a predetermined temperature. If the temperature of the die-casting mold 10 satisfies a requirement of the die-casting process, step 102 may be omitted.

In step 103, a metallic outer frame 20 is positioned in the cavity 142 of the female die 14 as an insert. The outer frame 20 includes a plurality of latching portions 24 and defines a plurality of latching grooves 26 therein. The plurality of latching portions 24 are arranged on the inner surface 22 along an extending direction of the outer frame 20. The plurality of latching portions 24 are spaced from each other. Each latching portion 24 includes a pair of latching ribs 242 protruding from the inner surface 22 toward an inner side of the outer frame 20, and a receiving groove 245 between the pair of latching ribs 242.

The outer frame 20 may be made by die-casting, extruding, forging, or punching. In a preferred embodiment, the outer frame 20 is made by die-casting. The plurality of latching portions 24 and the plurality of latching grooves 26 may be made by a CNC (computer number control) process, or formed by a die-casting process. In a preferred embodiment, the plurality of latching portions 24 and the plurality of latching grooves 26 are formed by the die-casting process.

In step 104, the male die 12 is assembled onto the female die 14 to cover the cavity, thereby communicating the pouring gage 126 with the cavity 142.

In step 105, pressured molten metal-alloy enters into the cavity 142 via the pouring gate 126 to form an inner structural member 40 embedded in an inner side of the outer frame 20. The inner structural member 40 includes a plurality of engaging portions 43 corresponding to the plurality of receiving grooves 245, and a plurality of matching portions 45 corresponding to the plurality of latching grooves 26. Molten metal-alloy is molded to the outer frame 20 and cooled to form the inner structure 40, thereby forming the plurality of engaging portions 43 received in the plurality of receiving grooves 245, and forming the plurality of matching portions 45 respectively received in the plurality of latching grooves 26.

In step 106, the male die 12 is disassembled from the female die 14 to expose the cavity 142.

In step 107, the outer frame 20 and the inner structural member 40 are removed from the female die 14.

In step 108, the outer frame 20 and the inner structural member 40 undergo a surface treating process. In the embodiment, burrs and other defects formed on the inner structural member 40 are removed by the surface treating process. If an appearance of the inner structural member 40 is qualified enough, step 108 may be omitted.

A surface treating process such as polishing step may be added between step 102 and step 103: the outer frame 20 undergoes a polishing process to remove burrs thereon, such that the outer frame 20 achieves a more attractive metallic appearance.

The outer frame 20 may be made from stainless steel, aluminum, titanium, or the like, thereby achieving a required appearance of the metallic housing 100. Additionally, because the inner structural member 40 is formed from metal-alloy material, a weight of the metallic housing 100 is reduced.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. A manufacturing method for a metallic housing of an electronic device, the method comprising:
   providing a die-casting mold comprising a male die and a female die engaging with the male die, the male die defining a pouring gate therein, and the female die defining a cavity therein corresponding to the pouring gate;
   positioning a metallic outer frame in the cavity of the female die as an insert, the outer frame comprising an inner surface, a plurality of latching portions protruding from the inner surface inwardly, and a plurality of latching grooves each formed between two adjacent latching portions, each latching portion comprising at least two parallel latching ribs, and a receiving groove formed between two adjacent latching ribs;
   assembling the male die to the female die to cover the cavity, thereby communicating the pouring gage with the cavity;
   casting pressured molten metal-alloy into the cavity via the pouring gate to form an inner structural member embedded in an inner side of the outer frame, the inner structural member comprising a plurality of engaging portions respectively embedded in the plurality of receiving grooves, and a plurality of matching portions respectively embedded in the plurality of latching grooves;
   dissembling the male die from the female die to expose the cavity; and
   removing the outer frame and the inner structural member from the female die, wherein the at least two latching ribs extend along an extending direction of the outer frame and transverse a corner of the metallic outer frame, and wherein the plurality of matching portions extend along a direction perpendicular to the extending direction of the metallic outer frame, and are respectively embedded in the plurality of latching grooves on two opposite sides of the receiving groove.

2. The manufacturing method of claim 1, further comprising preheating the die-casting mold to a predetermined temperature after positioning the metallic outer frame in the cavity of the female die as the insert and before assembling the male die to the female die to cover the cavity.

3. The manufacturing method of claim 1, further comprising applying a surface treating process to the outer frame and the inner structural member after removing the outer frame and the inner structural member from the female die.

4. The manufacturing method of claim 1, wherein the plurality of engaging portions and the plurality of matching portions protrude from the peripheral sidewall outwardly.

5. The manufacturing method of claim 1, wherein a cross-sectional view of the receiving groove is in a stepped shape or a rectangle.

6. The manufacturing method of claim 1, wherein each latching rib defines a pair of inclining surfaces on opposite ends to engage the latching groove in a dovetail shape.

7. The manufacturing method of claim 1, wherein the outer frame is made stainless steel, aluminum, or titanium, and the inner structural member is made from magnesium alloy, aluminum alloy, or zinc alloy.

8. The manufacturing method of claim 1, wherein the inner structural member is an inner metallic frame or an inner metallic board.

* * * * *